United States Patent
Pilling et al.

(10) Patent No.: US 7,554,379 B2
(45) Date of Patent: Jun. 30, 2009

(54) HIGH-SPEED, LOW-POWER LEVEL SHIFTER FOR MIXED SIGNAL-LEVEL ENVIRONMENTS

(75) Inventors: David J. Pilling, Los Altos Hills, CA (US); Mario Fulam Au, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 8 days.

(21) Appl. No.: 11/710,371

(22) Filed: Feb. 23, 2007

(65) Prior Publication Data
US 2008/0204109 A1    Aug. 28, 2008

(51) Int. Cl.
*H03L 5/00* (2006.01)
(52) U.S. Cl. ............... 327/333; 326/62; 326/63; 326/68; 326/80; 326/81
(58) Field of Classification Search ............... 327/333
See application file for complete search history.

(56) References Cited

U.S. PATENT DOCUMENTS

| | | | |
|---|---|---|---|
| 5,801,558 A * | 9/1998 | Freyman et al. ............ 327/112 |
| 5,834,948 A | 11/1998 | Yoshizaki et al. | |
| 5,933,025 A | 8/1999 | Nance et al. | |
| 5,959,490 A * | 9/1999 | Candage et al. ............ 327/333 |
| 6,064,227 A | 5/2000 | Saito | |
| 6,268,744 B1 | 7/2001 | Drapkin et al. | |
| 6,282,146 B1 | 8/2001 | Guo et al. | |
| 6,388,499 B1 | 5/2002 | Tien et al. | |
| 6,407,579 B1 | 6/2002 | Goswick | |
| 7,006,068 B2 * | 2/2006 | Haga ..................... 345/98 |
| 7,224,195 B2 | 5/2007 | Pilling et al. | |
| 2002/0153935 A1 | 10/2002 | Drapkin et al. | |
| 2005/0184768 A1 | 8/2005 | Pilling et al. | |
| 2007/0182448 A1 * | 8/2007 | Kwon et al. .................. 326/68 |
| 2007/0285135 A1 | 12/2007 | Pilling et al. | |

FOREIGN PATENT DOCUMENTS

| | | |
|---|---|---|
| DE | 11 2004 002 449 T2 | 10/2006 |
| GB | 2424135 | 9/2006 |
| WO | WO 2005/062468 A2 | 7/2005 |
| WO | WO 2005/062468 A3 | 7/2005 |

OTHER PUBLICATIONS

Notice of Allowance mailed Jan. 18, 2007, in related U.S. Appl. No. 11/009,434.

(Continued)

*Primary Examiner*—Kenneth B Wells
*Assistant Examiner*—John W Poos
(74) *Attorney, Agent, or Firm*—Finnegan, Henderson, et al.

(57) ABSTRACT

A level shifter is presented that allows fast switching while requiring low power. In accordance with some embodiments of the invention, the level shifter is a two stage level shifting circuit with p-channel and n-channel transistors biased so as to limit the potential between the source to gate or drain to gate of any of the transistors. Pull-up transistors are placed in a transition state so that spikes resulting from an increasing or decreasing input voltage turn on or off the pull up transistors to assist in the switching.

7 Claims, 8 Drawing Sheets

OTHER PUBLICATIONS

International Preliminary Report on Patentability and Written Opinion mailed Jun. 12, 2006, in counterpart PCT Application No. PCT/US2004/038239.

Examination Report received in U.K. Application No. GB0611457.3 dated Dec. 8, 2006.

Application as filed on May 4, 2007, in related U.S. Appl. No. 11/800,438.

Response to Examination Report filed Jun. 7, 2007, in U.K. Application No. GB0611457.3.

Notification of Grant dated Jul. 10, 2007, in U.K. Application No. GB0611457.3.

Office Action dated Oct. 1, 2008, in related U.S. Appl. No. 11/800,438.

* cited by examiner

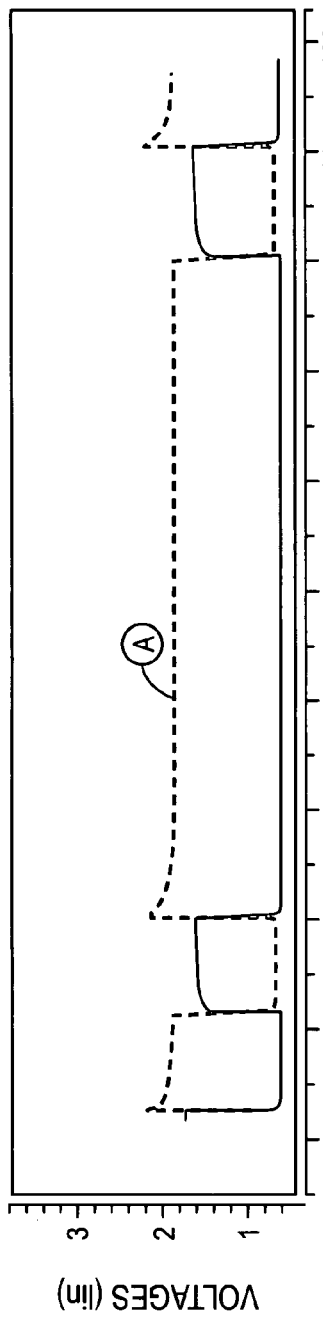
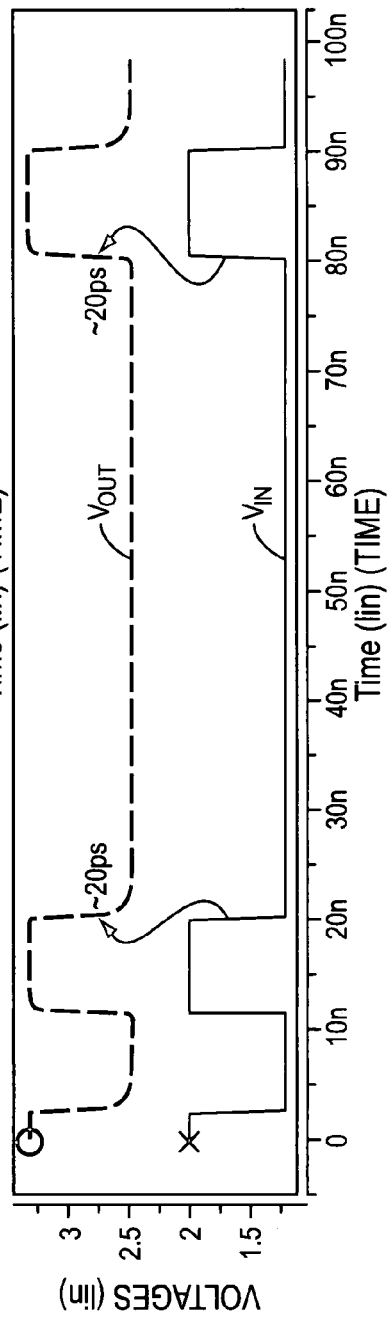
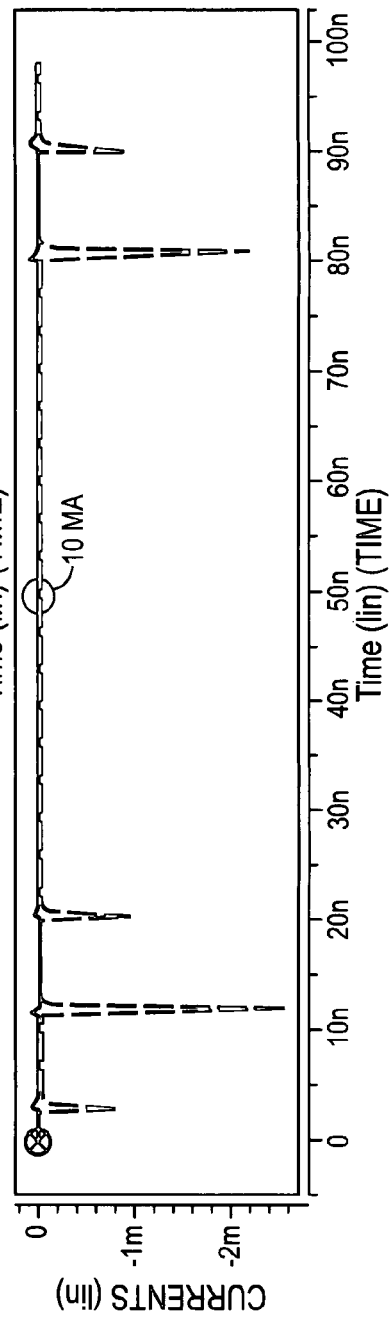
FIG. 10A
FIG. 10B
FIG. 10C

HIGH-SPEED, LOW-POWER LEVEL SHIFTER FOR MIXED SIGNAL-LEVEL ENVIRONMENTS

BACKGROUND

1. Field of the Invention

The present invention is related to a level shifter and, in particular, to a high-performance level shifter for use with thin gate-oxide devices.

2. Discussion of Related Art

Circuit development is often a result of technological change. In the 1960's the N-channel MOS gate oxide thicknesses were about 2000 Å in order to support gate bias potentials of about 18 volts. In the last ten years, products that were designed with 130 Å thick gates for five volt supplies are now designed for operating supply voltages of 3.3 volts with core supplies of 2.5 volts. More recent designs with core voltages of 1.0 volts have 3.3 volt external drives with gate oxides of core transistors of 16 Å gate thicknesses. These later reductions to one volt supply designs now require the added expense of a dual oxide process, for example an 80 Å process for device potentials of 3.3 volts and a 16 Å process for device potentials of 1.0 volts. The lower device potentials can result in lower power consumption.

Further, many devices still utilize a higher voltage power supply, even when some of the integrated circuits are formed with thinner gate oxides (and therefore are designed for lower voltage applications). Application of voltages greater than the design specification for a particular gate oxide thickness can result in damage to the transistor. Further, application of high voltage power supplies in circuits that are formed with lower voltage transistors can affect the timing of those circuits.

Additionally, there is always interest in providing circuits that utilize less power, and therefore are less likely to damage the thin oxides, and that operate faster. Therefore, there is a need for circuits capable of switching between voltages at high speed while using low power so as to not damage the thin gate-oxides of the devices.

SUMMARY

In accordance with some embodiments of the present invention, a level shifter is presented that allows for fast switching times. In some embodiments, the level shifter is protected from over voltage situations that can damage the thin gate oxide material.

Some embodiments of a level shifter according to the present invention can include a first transistor coupled between a first node and ground, the gate of the first transistor coupled to receive an input voltage; a second transistor coupled between a second node and a first bias voltage, the second node coupled to provide an output voltage, the gate of the second transistor coupled to the first node; a capacitance coupled between the first node and ground; a third transistor coupled between a power voltage and the first node, the gate of the third transistor coupled through a resistance to a second power voltage such that the third transistor is in a threshold state during quiescence; and a fourth transistor coupled between the second node and the power level, the gate of the fourth transistor being coupled through a resistance the second power voltage such that the fourth transistor is in a threshold state during quiescence.

In some embodiments, the first and second transistors are n-channel transistors and the third and fourth transistors are p-channel transistors. In some embodiments, the capacitance coupled between the first node and ground includes a first capacitance transistor coupled between the source of the first transistor and a charging transistor, which is coupled to a second bias voltage, the gate of the charging transistor being coupled to the second resistance.

Some embodiments of level shifter according to the present invention can include a first bias limiting transistor and a second bias limiting transistor coupled serially between the first transistor and the third transistor; and a third bias limiting transistor and a fourth bias limiting transistor coupled serially between the second transistor and the fourth transistor, wherein the gates of the first bias limiting transistor and the third bias limiting transistor are coupled to a third bias voltage and the gates of the second bias limiting transistor and the fourth bias limiting transistor are coupled to a fourth bias voltage. In some embodiments, the first bias limiting transistor and the third bias limiting transistor are n-channel transistors and the second bias limiting transistor and the fourth bias limiting transistor are p-channel transistors.

In some embodiments, a level shifter according to the present invention can include a first capacitive transistor coupled between the first resistance and the gate of the first transistor; and a second capacitive transistor coupled between the second resistance and the gate of the second transistor.

A method of level shifting according to some embodiments of the present invention includes precharging a first node located between a first transistor and a third transistor, the first and the third transistor being serially coupled between a power voltage and ground, the first node being coupled to the gate of a second transistor that is coupled serially with a fourth transistor between the power voltage and ground; and placing the third transistor and the fourth transistor in a transition state, wherein on receipt of an increasing voltage at the gate of the first transistor, the third transistor is shut off and the fourth transistor is turned on by spike voltages, and wherein on receipt of a decreasing voltage at the gate of the first transistor, the third transistor is turned on and the fourth transistor is shut off by spike voltages.

These and other embodiments of the invention are further discussed below with reference to the following figures. It is to be understood that both the foregoing general description and the following detailed description are exemplary and explanatory only and are not restrictive of the invention, as claimed.

BRIEF DESCRIPTION OF THE DRAWINGS

FIGS. 10A through 10D illustrate performance characteristics of some embodiments of level shifters such as that shown in FIG. 6A.

In the figures, elements having the same designation have the same or similar functions.

DETAILED DESCRIPTION

In accordance with some embodiments of the present invention, a circuit that converts a low voltage signal to a high voltage signal with a swing that does not damage the thin gate oxides is presented. Conventional circuits that perform this task have characteristic delays of nanoseconds and power dissipation of milliwatts. Some circuits according to the present invention have delays measured in picoseconds and power dissipation measured in microwatts.

In accordance with some embodiments of the present invention, a two stage level shifting circuit includes p-channel and n-channel transistors biased so as to limit the potential drops between the source gate and between the gate and drain of the series p-channel transistor, and the voltage potential drops between the drain and gate and between the gate and source of the n-channel transistors to within the reliability limits of the transistors. The source nodes of pull-down n-channel transistors of both stages are source biased to limit the gate to source potentials within the reliability limits of the transistors. A level shifter according to the present invention can be switched by polarity switching of an inverting circuit by a transistor configured as a capacitor with one terminal on the input node of the inverting circuit and the other node to the gate of the p-channel pullup transistor. Polarity switching of an inverting circuit by inversion of the p-channel pullup acting as a capacitor with one terminal on the input node of the drain of the pullup transistor and the gate of the same pullup transistor. In some embodiments, pull-up resistors are coupled to supply voltages that are less than one-half of the threshold potential drop of the source voltages of the p-channel pull-up transistors. In some embodiments, the source of an n-channel feedback transistor is coupled to the drain of the input n-channel transistors. The gate of the n-channel feedback transistor is coupled to the output node of the first stage. The drain of the feedback transistor is coupled to a bias voltage sufficient to prevent a potential voltage loss on the output node of the first stage with leakage current.

Figure 1:
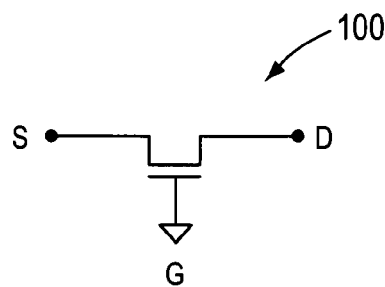
FIG. 1 illustrates a common gate configuration for an n-MOS transistor.

FIG. 1 shows a gate circuit configuration, which is the building block of the design of level shifting circuits according to embodiments of the present invention. The configuration shown is a metal-oxide semiconductor MOS transistor 100 with a source (S), drain (D) and gate (G). Transistor 100 as shown in FIG. 1 has a low turn-on delay because of a unity current gain and an input impedance that is approximately 1/gm, where gm is the transconductance of the transistor. The low input impedance contributes to a low RC time constant load for an input driver, and hence a fast switching time.

Figure 2:
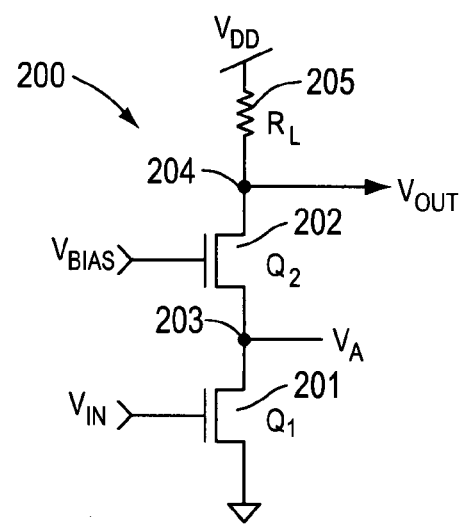
FIG. 2 illustrates a simple level shifter.

FIG. 2 shows a conventional common-gate level shifter 200. As shown in FIG. 2, shifter 200 includes transistors 201 and 202 coupled in series between a power voltage $V_{dd}$ and ground. Transistors 201 and 202 can be similar to transistor 200 shown in FIG. 1. The gate of transistor 201 is coupled to accept an input voltage $V_{IN}$ whereas the gate of transistor 202 is coupled to accept a bias voltage $V_{Bias}$. The source of transistor 202 is coupled through a resistor 205 to power voltage $V_{dd}$, the drain of transistor 202 is coupled to the source of transistor 201 at node 203, and the drain of transistor 201 is coupled to ground. The output voltage $V_{OUT}$ is the voltage at node 204, which is located between resistor 205 and the source of transistor 202.

In operation, if $V_{IN}$ is low, transistor 201 is off allowing the voltage at node 203 to charge. Transistor 202 is therefore off and the output voltage $V_{OUT}$ is pulled up by resistor 205 to rail voltage $V_{dd}$. If Vin is high, then transistor 201 turns on, discharging node 203 and turning transistor 202 on. With both transistors 201 and 202 on, voltage $V_{OUT}$ is pulled to a low voltage. One problem with this type of circuit is that the voltage applied across the transistors may be high enough to damage the thin gate oxides of the transistors. Furthermore, the power required when $V_{OUT}$ is held low, essentially the current flowing through resistor 205, can be high.

Figure 3:
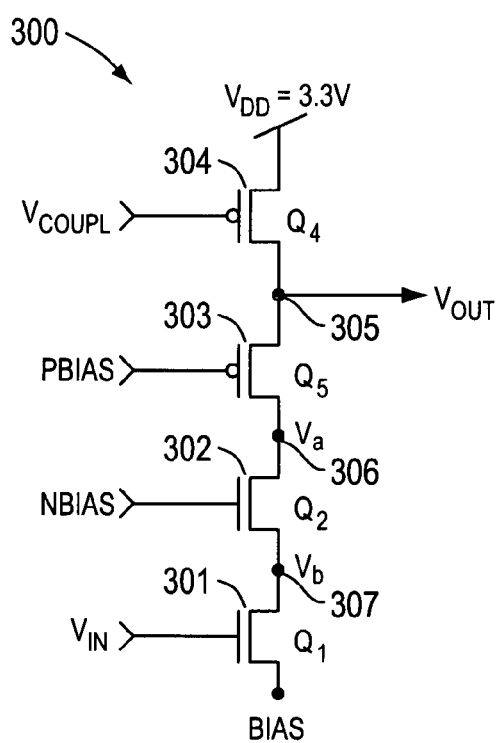
FIG. 3 illustrates a double transistor level shifting stage.

FIG. 3 illustrates a double transistor level shifter stage 300. Stage 300 includes transistors 301, 302, 303, and 304 coupled in series between power voltage $V_{dd}$ and a bias voltage. Transistors 301 and 302 are n-MOS transistors while transistors 303 and 304 are p-MOS transistors. The gate of transistor 301 is coupled to input voltage Vin. The gate of transistor 302 is coupled to a bias voltage NBias. The gate of transistor 303 is coupled to bias voltage pBias, and the gate of transistor 304 is coupled to a voltage Vcouple. The output voltage $V_{OUT}$ is at node 305 located between transistor 304 and transistor 303.

For illustration, typical voltages for the double transistor level shifting stage shown in FIG. 3 is $V_{dd}$~3.3 V, Pbias=NBias~2.0 V, Bias~0.7 V, and $V_{IN}$=0 to ~1.2 V. Under those conditions, the voltage $V_{OUT}$ swings from ~3.3 V to ~2.5 V. Voltage $V_{OUT}$ is clamped to about PBias. Node 306, Va, swings from about 3.3 V to about 0.7 V, its low voltage level being clamped by the voltage Bias. Node 307, Vb, swings from about 1.6 volts to about 0.7 volts, with the upper level of about 1.6 voltage being about a threshold drop below NBias.

The clamping action of transistors 302 and 303 prevents the gate-to-drain and gate-to-source voltages of transistors 301, 302, 303, and 304 from exceeding the process and device reliability limits of chip fabrication for thin oxide transistors. However, the switching speed of the level shifting circuit is slow because of the need to switch the input voltage serially through several transistors.

Figure 4:
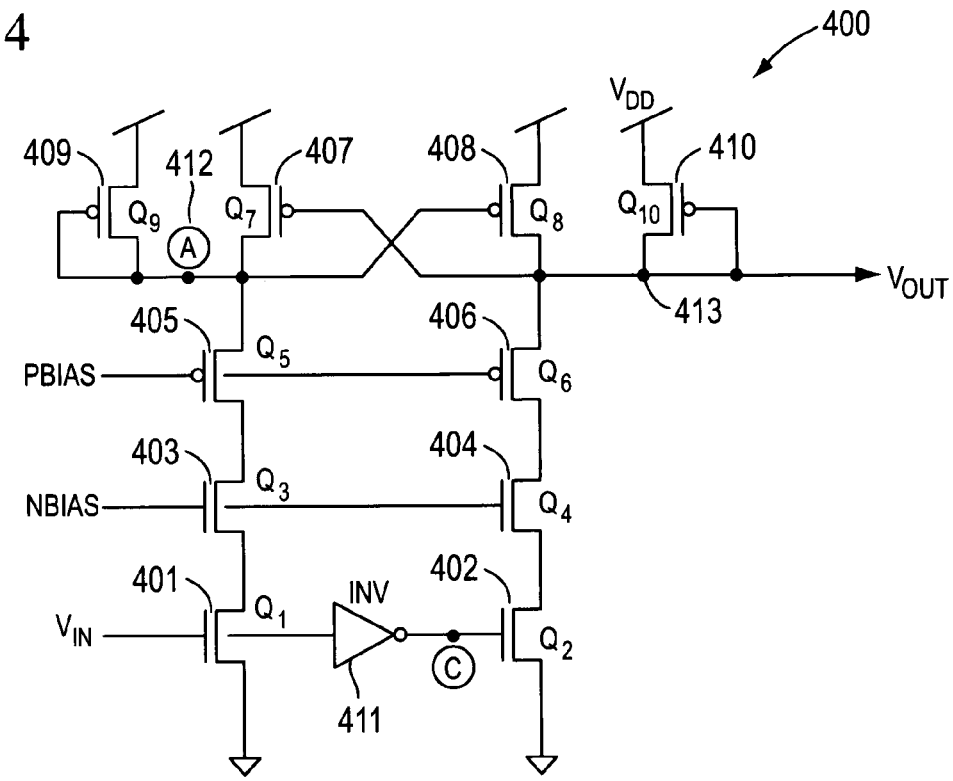
FIG. 4 illustrates a double bias transistor, dual stage level shifter.

FIG. 4 illustrates another differential level shifter 400. Shifter 400 is a dual-stage differential level shifter with transistor clamps to the power rail. As shown in FIG. 4, p-MOS transistor 405, n-MOS transistor 403, and n-MOS transistor 401 are coupled serially between node 412 and ground. Additionally, p-MOS transistor 406, n-MOS transistor 404, and n-MOS transistor 402 are coupled serially between node 413 and ground. The gate of transistor 401 is coupled to input voltage $V_{IN}$. Additionally, input voltage $V_{IN}$ is inverted in inverter 411 and coupled to the gate of transistor 402. As shown, the drains of transistors 401 and 402 are coupled to ground. A voltage NBias is coupled to the gates of transistors 403 and 404, respectively, whose drains are coupled to the sources of transistors 401 and 402, respectively. A voltage PBias is coupled to the gates of transistors 405 and 406, whose drains are coupled to the sources of transistors 403 and 404. Transistor 409 is coupled between node 412 and power voltage $V_{dd}$ with the gate of transistor 409 coupled to node 412. Similarly, transistor 410 is coupled between node 413 and power voltage $V_{dd}$ with the gate of transistor 410 coupled to node 413. Transistor 407 is coupled between node 412 and power voltage $V_{dd}$ with the gate of transistor 407 coupled to node 413. Similarly, transistor is coupled between node 413 and power voltage $V_{dd}$ with the gate of transistor 408 coupled to node 412. The output voltage of the level shifter is node 413.

As before, bias clamping transistors 409 and 410 clamp voltages at node 412 and 413 to power level $V_{dd}$. Bias clamping transistors 409 and 410 allow the use of thin oxide transistors without damage to the thin gate oxides. The limitation of the level shifter shown in FIG. 4 are twofold: excessive delays and power consumption. Excessive delays result from the sequence of serial and parallel circuit events that must occur for a change in the input voltage $V_{IN}$ to be transmitted to a change in the output voltage $V_{OUT}$. The serial events occur when $V_{IN}$ triggers $V_A$ at node 412, which in turn triggers the output voltage $V_{OUT}$ at node 413. In turn, the change in voltage $V_{OUT}$ at node 413 triggers $V_A$ at node 412. Excessive power results when one side of the differential shifter is on while the other is off. Such a situation either draws current from the transistor clamp 410 that maintains the low level of $V_{OUT}$ at one diode drop below the power level $V_{dd}$ or from transistor clamp 409 that maintains the voltage $V_A$ at node 412 at one diode drop below the power level $V_{dd}$.

Figure 5:
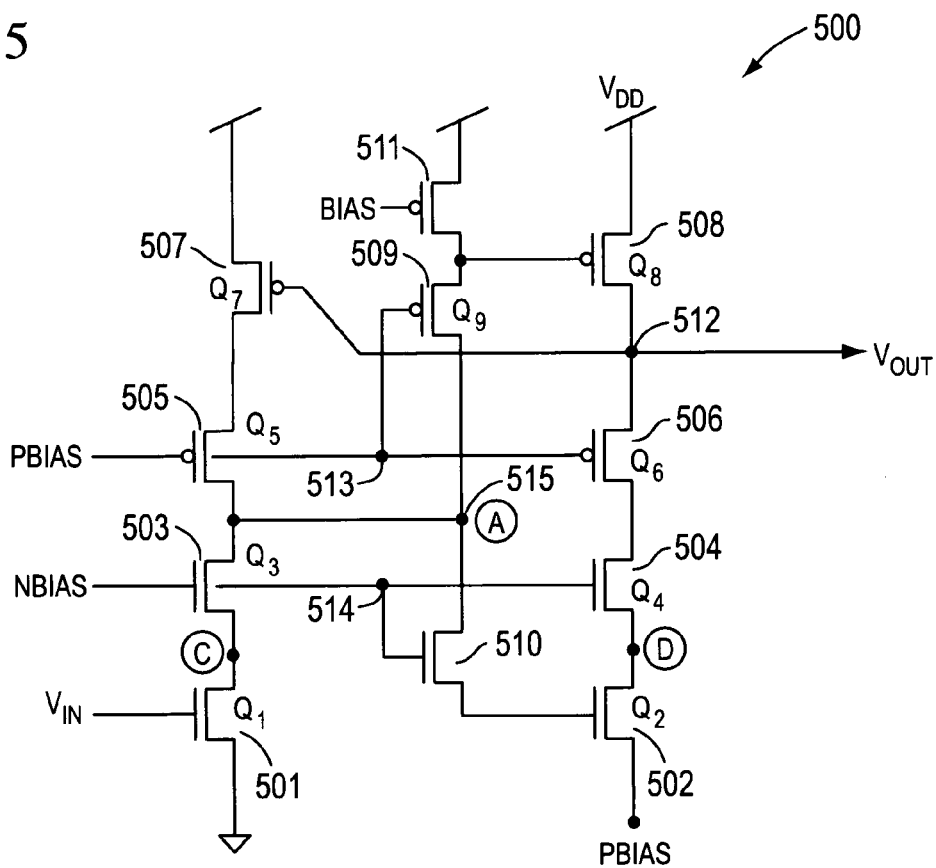
FIG. 5 illustrates another example of a level shifter.

FIG. 5 illustrates a double bias, dual stage level shifter 500. Such a shifter was originally described in U.S. application Ser. No. 11/009,434 by the same inventors as the present invention, which is herein incorporated by reference in its entirety. As shown in FIG. 5, level shifter includes transistors 501, 503, 505, and 507 serially coupled between power level $V_{dd}$ and ground. Further, transistors 502, 504, 506, and 508 are serially coupled between power level $V_{dd}$ and a bias voltage PBias. The input voltage is coupled to the gate of n-MOS transistor 501. A bias voltage NBias is coupled to the gate of n-MOS transistor 503 and to the gate of transistor 504. Bias voltage PBias is coupled to the gate of p-MOS transistor 505 and to the gate of p-MOS transistor 506. The output voltage $V_{OUT}$ is taken from node 512 located between p-MOS transistor 506 and p-MOS transistor 508. The gate of p-MOS transistor 507 is coupled to node 512. Node 515, electrically located between transistors 503 and 505, is coupled to the drain of a p-MOS transistor 509. Transistor 509 is coupled in series with p-MOS transistor 511, which is in turn coupled to power level $V_{dd}$. The drain of p-MOS transistor 509 is further coupled to the source of transistor 510, whose drain is coupled to the gate of transistor 502. The gate of transistor 511 is coupled to a bias voltage Bias. The gate of transistor 509 is coupled to voltage PBias at node 513. The gate of transistor 510 is coupled to NBias at node 514. the gate of transistor 508 is coupled to the drain of transistor 511.

Shifter 500 offers significant improvement in delays over shifter 400 of FIG. 4. The delay in shifter 500 is approximately 0.2 ns as opposed to the approximately 0.5 ns of shifter 400 shown in FIG. 4. However, shifter 500 shown in FIG. 5 also suffers from excessive quiescent power dissipation. Both shifter 400 and shifter 500 employ a feedback path from $V_{OUT}$ to the gate of transistor 507 or gate 407, respectively, which permits excessive power dissipation to occur during transitions of $V_{OUT}$ going from low to high or from high to low.

Figure 6A:
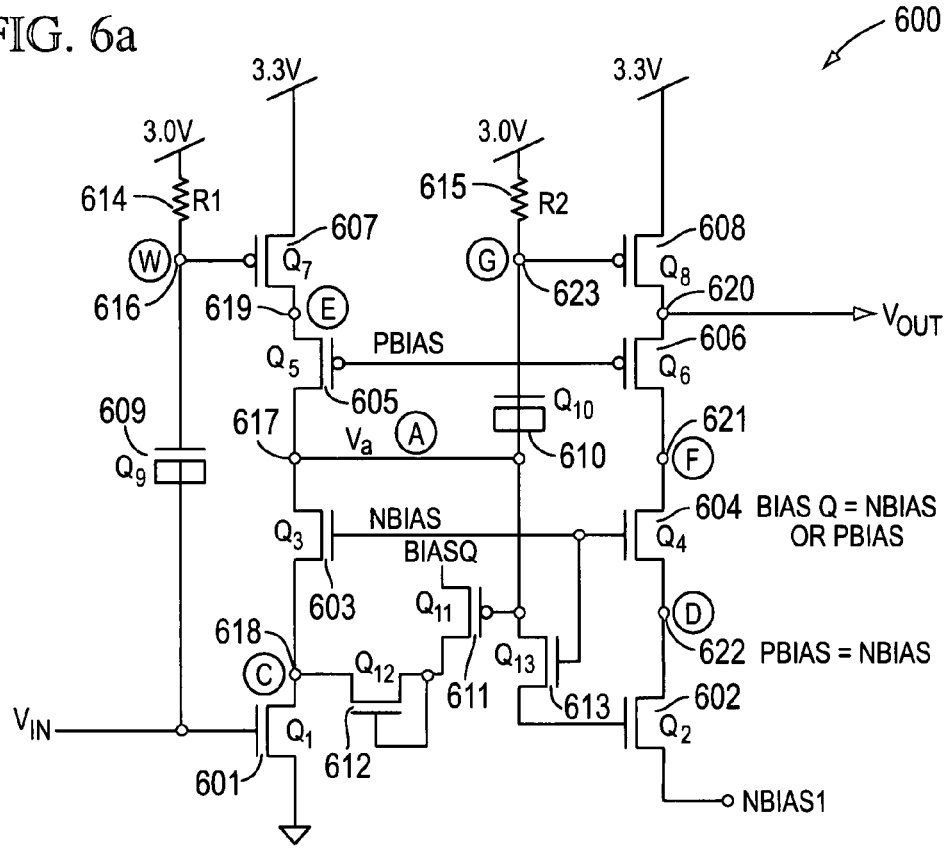
FIGS. 6A and 6B illustrate examples of high speed level shifters according to some embodiments of the present invention.

FIG. 6A illustrates a level shifter 600 according to some embodiments of the present invention. As shown in FIG. 6A, level shifter includes transistors 601, 603, 605, and 607 serially coupled between power level $V_{dd}$, shown for example as 3.3V in FIG. 6A, and ground. Furthermore, transistors 602, 604, 606, and 608 are serially coupled between power level $V_{dd}$ and a bias voltage NBias1. The gate of transistor 601 is coupled to input voltage $V_{IN}$ and the drain of transistor 608 is at the output voltage $V_{OUT}$. The gates of transistors 603 and 604 are coupled to bias voltage NBIAS. The gates of transistors 605 and 606 are coupled to bias voltage PBIAS. The gate of transistor 607 is coupled through a resistor 614 to a second power level, $V'_{dd}$, which for example is shown in FIG. 6A as about 3.0 V. As further shown in FIG. 6A, a transistor configured as a capacitor 609 is coupled between the gate of transistor 607, node 616, and input voltage $V_{IN}$. A resistor 615 is coupled between the gate of transistor 608 and the second power level $V'_{dd}$, which in FIG. 6A is shown, for example, as about 3.0 V. A capacitor 610 is coupled between the gate of transistor 608 and a node 617, which is located between transistors 603 and 605. A transistor 613 is coupled between node 617 and the gate of transistor 602. The gate of transistor 613 is coupled to the bias voltage NBias. P-MOS transistor 611 and n-MOS transistor 612 are serially coupled between a bias voltage BIASQ and the source of transistor 601, node 618. The gate of transistor 611 is coupled to node 617. The gate of transistor 612 is coupled to the drain of transistor 611. Bias voltage NBias1, BIASQ, PBias, and NBias are set to protect the gate to source and gate to drain voltages of the transistors from over voltage.

As shown in FIG. 6A, the input stage of level shifter 600, is input voltage $V_{IN}$ coupled to the gate of transistor 601 and the source and drain terminals of transistor 609 acting as a coupling capacitor to the gate of transistor 607. Bias transistors 603 and 605 constrain swings of voltage $V_A$ at node 617, $V_C$ at node 618, and $V_E$ at node 619 to be within device reliability limits. The second stage is driven by node 617, voltage $V_A$, which is tied to the source and drain terminals of transistor 610, the gate of which is coupled to the gate of transistor 608. Node 617 is coupled to the gate of transistor 602 and acts as a low level driving switch. Bias transistors 604 and 602 constrain the swings of node 620, $V_{OUT}$, node 621, and node 622 to device reliability limits.

The first and second stages of level shifter 600 also include pull up transistors 607 and 608, respectively, whose gates are tied to coupling transistors 609 and 610, respectively. The gates of transistors 607 and 608 are also tied to resistors 614 and 615, respectively, that are coupled to a voltage $V'_{dd}$, which is at one-half threshold below that of the drains of transistors 607 and 608. Consequently, transistors 607 and 608 are in the sub-threshold active operating transistor region during quiescent standby.

Figure 6B:
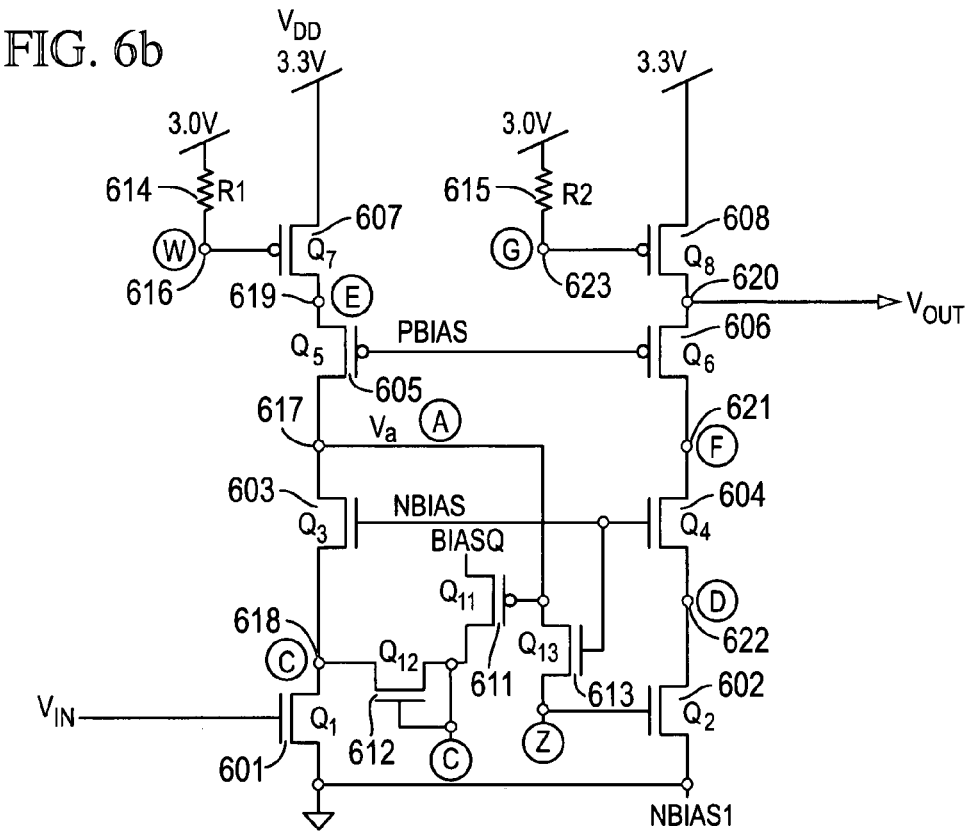

FIG. 6B illustrates another embodiment of level shifter 600 according to the present invention. In the embodiment of level shifter 600 shown in FIG. 6B, coupling transistors 609 and 610 have been eliminated. Coupling transistors 609 and 610 can serve to speed the switching time of level shifter 600.

In operation, transistors 607 and 608 are biased into the onset of the active regions where a conductive inversion layer under the gate oxide acts as a conductive capacitor plate. In such a state, transistors 607 and 608 are easily triggered to aid in the switching time of level shifter 600.

Figure 7A:
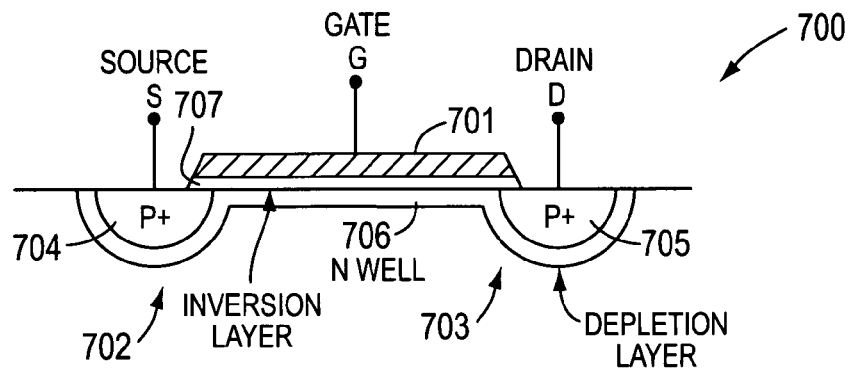
FIG. 7A illustrates a P-channel MOS transistor cross section.
Figures 7B, 7C:
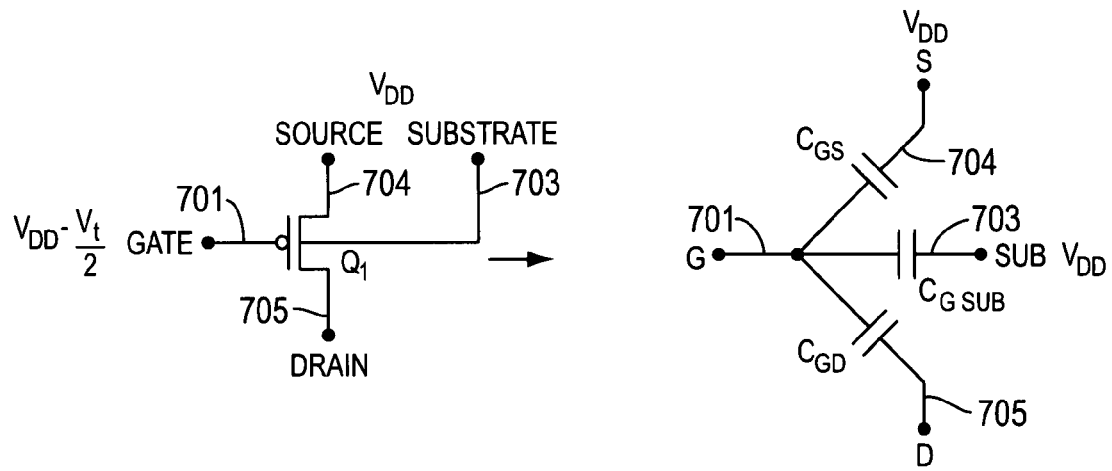
FIGS. 7B and 7C illustrate the symbol and equivalent capacitor modeling, respectively, of the p-channel MOS transistor illustrated in FIGS. 7A and 7B.

FIG. 7A shows a p-MOS transistor device cross section, the symbol of which is illustrated in FIG. 7B. As shown in FIG. 7A, a p-MOS transistor includes an N-well 703 in a substrate, a source 704 formed of p-type material, a drain 705 formed of p-type material, and a gate 701 formed over the depletion region 706 separated source 704 from drain 705. A thin oxide 707 separates the gate material of gate 701 from depletion region 706. The typical electrical symbol utilized for p-MOS transistor 700 shown in FIG. 7A is shown in FIG. 7B. Typically, source 704 is coupled to a higher voltage than drain 705. Substrate 703 is typically tied to power level $V_{dd}$.

At the onset of inversion, the inversion layer at depletion region 706 becomes a conductive plate. A capacitor is then formed between the inversion layer at the depletion region 706 and gate 701, with thin oxide 707 servicing as the dielectric layer. The capacitive equivalent circuit for p-MOS transistor 700 is shown in FIG. 7C. As illustrated in FIG. 7C, and recognized from the device structure shown in FIG. 7A, capacitors are formed between gate 701 and substrate 703, between gate 701 and source 704, and between gate 701 and drain 705. These capacitors can hold charge.

Figure 8A:
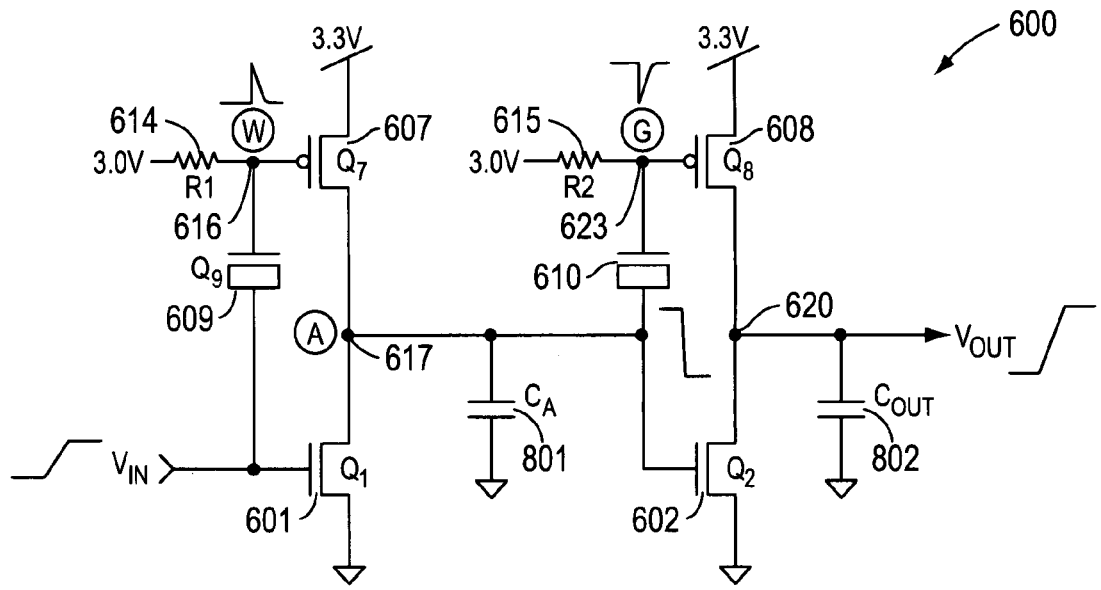
FIG. 8A illustrates a simplified level shifting circuit according to some embodiments of the present invention with a rising input waveform.
Figure 8B:
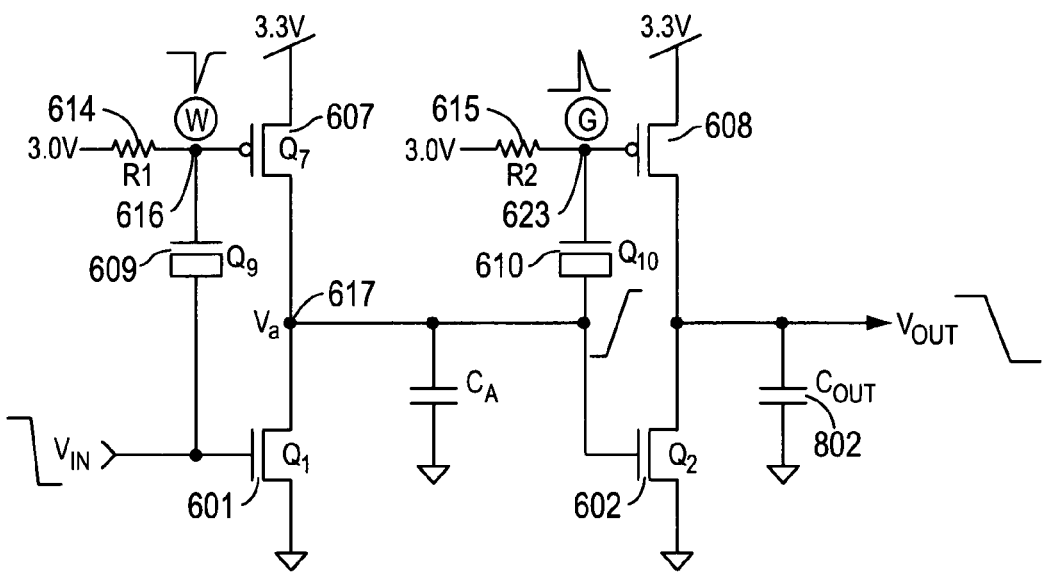
FIG. 8B illustrates a simplified level shifting circuit according to some embodiments of the present invention with a falling input waveform.

Referring again to FIGS. 6A and 6B, it can be seen that a voltage change at nodes 619 and 620 transfers charge, either positive or negative, onto nodes 616 or 623. FIGS. 8A and 8B illustrate a simplified level shifter circuit such as that shown in FIG. 6A. In FIGS. 8A and 8B, for ease of explanation, clamping transistors 603, 604, 605, and 606 shown in FIGS. 6A and 6B have been omitted. Additionally, transistors 611 and 612 have been replaced by their equivalent capacitor 801. An additional equivalent capacitor 802 is shown on node 620. As shown in FIGS. 8A and 8B, transistors 607 and 608 are biased to the onset of threshold voltage $V_T$ such that a positive or negative perturbation will momentarily turn on or turn off these transistors.

FIG. 8A illustrates the response of level shifter 600 upon a rising input voltage $V_{IN}$. The rising input voltage on the gate of transistor 601 creates a positive spiking voltage waveform at node 616 at the gate of transistor 607, momentarily shutting transistor 607 off while transistor 601 firmly turns on. When transistor 601 turns on, node 617 and capacitor 801 are both discharged to ground. The falling waveform of node 617 is coupled into node 623 as a falling spiking voltage, which turns transistor 608 on. Transistor 602 is turned off by the discharge of node 617. Consequently, the capacitor 802 is charged to the power supply $V_{dd}$ by transistor 608.

In the embodiment shown in FIG. 6B, which does not include coupling capacitor 609, the voltage change at $V_{IN}$ is coupled to node 616 through the transistor capacitance, which is illustrated in FIGS. 7A and 7C. When transistor 601 turns on, current is pulled from node 619, which results in a spike at node 616.

As is illustrated in FIG. 8B, a falling input voltage, $V_{IN}$, creates a negative spiking voltage at node 616, momentarily turning transistor 607 on to charge capacitor $C_A$ and cause a positive spike at node 623, turning transistor 608 off. A rising voltage on node 617 will turn transistor 602 on and discharge capacitor 802, causing the output voltage $V_{OUT}$ to go low.

As with all dynamic circuits, leakage currents degrade coupled potentials. A minimum sized, feedback transistor shown in FIG. 6A, transistor 611, retains the high level charge stored on node 617, thereby ensuring static performance.

Figure 9:
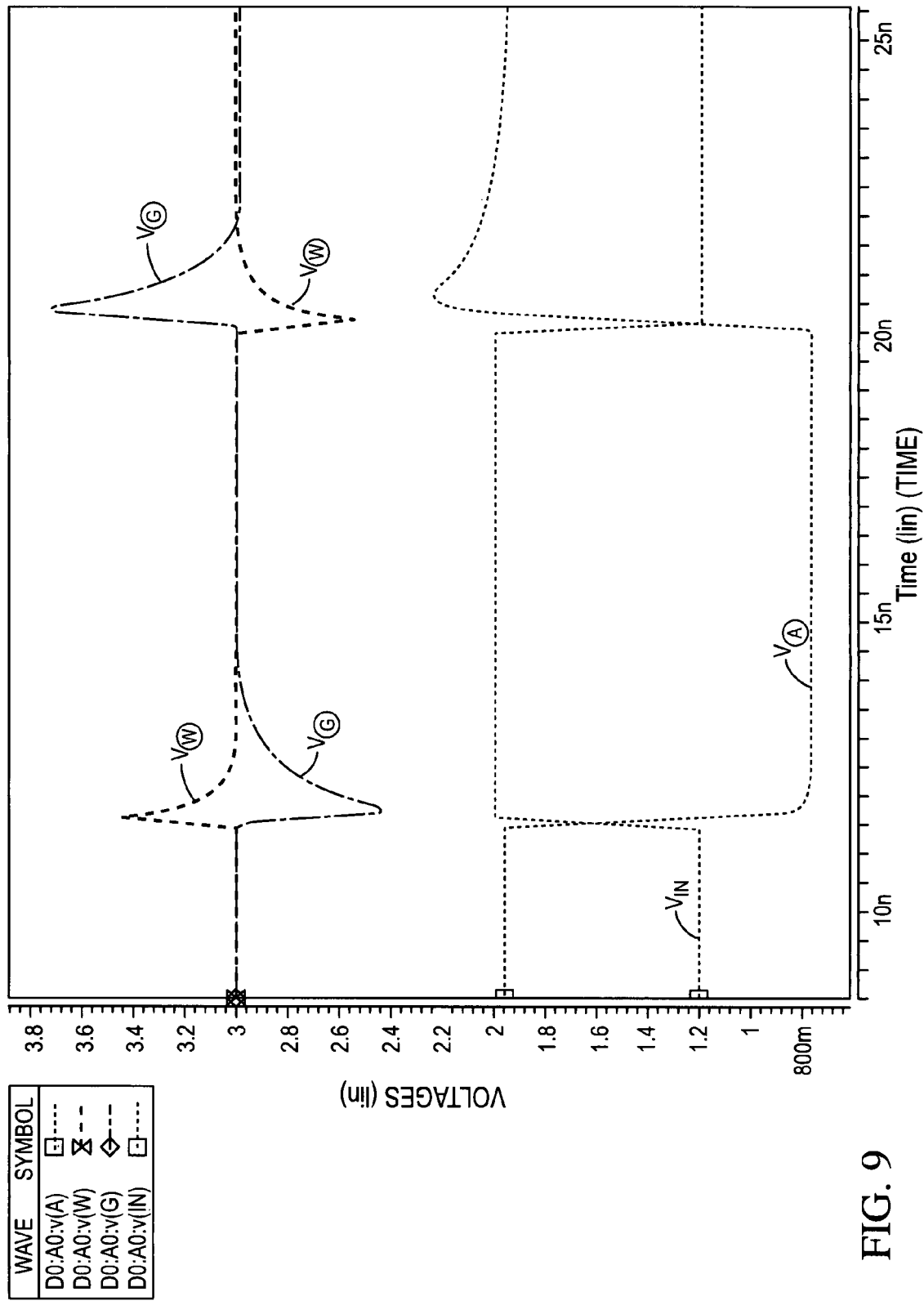
FIG. 9 illustrates the timing of input and output waveforms on a level shifter such as that shown in FIG. 6A.

FIG. 9 shows simulated waveforms for the performance of the circuit illustrated in FIG. 6A. FIG. 9 shows the input voltage $V_{IN}$, the spikes at node 616, $V_W$, and node 623, $V_G$, as well as the voltage at node 617, $V_A$, during both an increasing input voltage and a decreasing input voltage. What is particular interesting in FIG. 9 is the speed at which responses at nodes 616, 623, and 617 are observed with respect to changes in the input voltage $V_{IN}$.

Figure 10D:
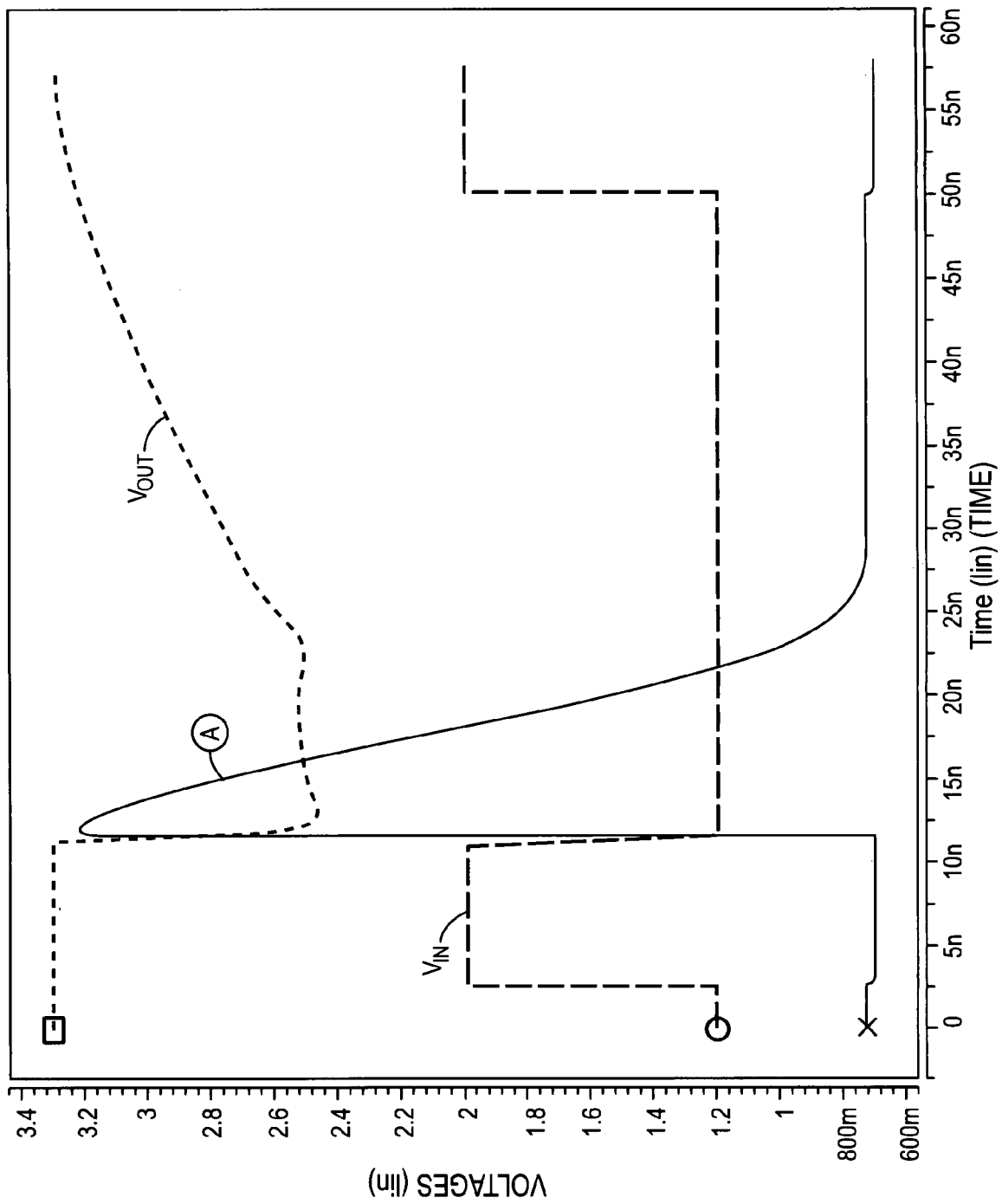

As shown in FIGS. 6A and 6B, the voltage at node 618 is held by transistors 611 and 612. FIG. 10A illustrates the voltage at node 617, $V_A$, as the input voltage $V_{IN}$ transitions from high to low states and from low to high states. As is shown in FIG. 10A, when $V_{IN}$ is in a high state, turning transistor 601 on, the voltage at node 617 is dragged low. When $V_{IN}$ is in a low state, however, the voltage at node 617 is kept at a high state by transistors 611 and 612. With voltage $V_A$ at a high state, transistor 602 is on, dragging node 620 $V_{OUT}$ to a low state. If the charge leaks off node 617, resulting in transistor 602 being turned off, then the voltage at $V_A$ floats to a high state from the desired low state. FIG. 10D illustrates the performance of level shifter 600 shown in FIG. 6 if transistors 611 and 612 are omitted. With a square input voltage, once $V_{IN}$ goes low $V_A$ charges to a high state and then decays as the charge leaks from node 617. The output voltage $V_{OUT}$, in turn, starts at a low state (about 2.6 V) and floats to a high state once transistor 602 has turned off.

FIG. 10B illustrates the performance of level shifter 600 as shown in FIG. 6A. The input voltage $V_{IN}$ and output voltage $V_{OUT}$ is shown in FIG. 10B. As can be seen, the response time between transitions of voltage $V_{IN}$ and transitions of voltage $V_{OUT}$ is about 20 ps. FIG. 10C illustrates the current drawn from power voltage $V_{dd}$ as the voltage $V_{IN}$ makes the transitions shown in FIG. 10B. As can be seen, very little current is drawn while level shifter 600 is in a quiescent state (i.e., no changes in $V_{IN}$. Current is drawn as voltage $V_{IN}$ transitions from low to high or from high to low state. The current drawn during the quiescent state in some embodiments of the invention can be about 10 μA.

One skilled in the art will recognize variations and modifications of the examples specifically discussed in this disclosure. These variations and modifications are intended to be within the scope and spirit of this disclosure. As such, the scope is limited only by the following claims.

What is claimed is:

1. A level shifter, comprising:
   a first transistor coupled between a first node and ground, the gate of the first transistor coupled to receive an input voltage;
   a second transistor coupled between a second node and a first bias voltage, the second node coupled to provide an output voltage, the gate of the second transistor coupled to the first node;
   a capacitance coupled between the first node and ground;
   a third transistor coupled between a power voltage and the first node, the gate of the third transistor coupled through a resistance to a second power voltage such that the third transistor is in a threshold state during quiescence; and
   a fourth transistor coupled between the second node and the power level, the gate of the fourth transistor being coupled through a resistance to the second power voltage such that the fourth transistor is in a threshold state during quiescence.

2. The level shifter of claim 1, wherein the first and second transistors are n-channel transistors and the third and fourth transistors are p-channel transistors.

3. The level shifter of claim 1, wherein the capacitance coupled between the first node and ground includes a first capacitance transistor coupled between the source of the first transistor and a charging transistor, which is coupled to a second bias voltage, the gate of the charging transistor being coupled to the second resistance.

4. The level shifter of claim 1, further comprising:
   a first bias limiting transistor and a second bias limiting transistor coupled serially between the first transistor and the third transistor; and
   a third bias limiting transistor and a fourth bias limiting transistor coupled serially between the second transistor and the fourth transistor,
   wherein the gates of the first bias limiting transistor and the third bias limiting transistor are coupled to a third bias voltage and the gates of the second bias limiting transistor and the fourth bias limiting transistor are coupled to a fourth bias voltage.

5. The level shifter of claim 4, wherein the first bias limiting transistor and the third bias limiting transistor are n-channel transistors and the second bias limiting transistor and the fourth bias limiting transistor are p-channel transistors.

6. The level shifter of claim 1, further including
   a first capacitive transistor coupled between the first resistance and the gate of the first transistor; and a second capacitive transistor coupled between the second resistance and the gate of the second transistor.

7. A method of level shifting, comprising:

precharging a first node located between a first transistor and a third transistor, the first and the third transistor being serially coupled between a power voltage and ground, the first node being coupled to the gate of a second transistor that is coupled serially with a fourth transistor between the power voltage and ground; and placing the third transistor and the fourth transistor in a transition state, wherein on receipt of an increasing voltage at the gate of the first transistor, the third transistor is shut off and the fourth transistor is turned on by spike voltages, and wherein on receipt of a decreasing voltage at the gate of the first transistor, the third transistor is turned on and the fourth transistor is shut off by spike voltages.

* * * * *